United States Patent
Zhu et al.

[11] Patent Number: 6,133,079
[45] Date of Patent: Oct. 17, 2000

[54] METHOD FOR REDUCING SUBSTRATE CAPACITIVE COUPLING OF A THIN FILM INDUCTOR BY REVERSE P/N JUNCTIONS

[75] Inventors: Min Zhu; Kai Shao; Shao-Fu Sanford Chu, all of Singapore, Singapore

[73] Assignee: Chartered Semiconductor Manufacturing Ltd., Singapore, Singapore

[21] Appl. No.: 09/358,985

[22] Filed: Jul. 22, 1999

[51] Int. Cl.[7] ............................................... H01L 21/8238
[52] U.S. Cl. .......................... 438/210; 438/238; 438/381
[58] Field of Search ..................................... 438/210, 228, 438/233, 238, 381

[56] References Cited

U.S. PATENT DOCUMENTS

| | | | |
|---|---|---|---|
| 5,450,263 | 9/1995 | Desaigoudar et al. | 360/110 |
| 5,539,241 | 7/1996 | Abidi et al. | 438/210 |
| 5,736,749 | 4/1998 | Xie | 257/3 |
| 5,770,509 | 6/1998 | Yu et al. | 438/381 |

*Primary Examiner*—Chandra Chaudhari
*Attorney, Agent, or Firm*—George O. Saile; Rosemary L. S. Pike

[57] ABSTRACT

A method for reducing the capacitive coupling of an inductor on an integrated circuit chip is described. The method forms the inductor over an accumulation of dielectric layers used elsewhere in the integrated circuit. In addition two back-to-back reversed p/n junctions are formed within the silicon substrate below the inductor. The junctions are serially connected and, along with the capacitance of the dielectric layers, reduce the capacitive coupling of the inductor to the substrate by a factor of between about 2 and 20 over the that of the dielectric layers alone. The decrease in capacitance improves the performance of the inductor at high operating frequencies, for example, above1 GHz. The junctions are easily formed in a twin-well CMOS circuit by the addition of only a single additional processing step. The additional step comprises the deep implantation of phosphorous to form an n-type zone between the p-well and the substrate in the region over which the inductor is formed. The junctions are not externally biased and sustain continuous depletion regions between the inductor and the substrate.

21 Claims, 5 Drawing Sheets

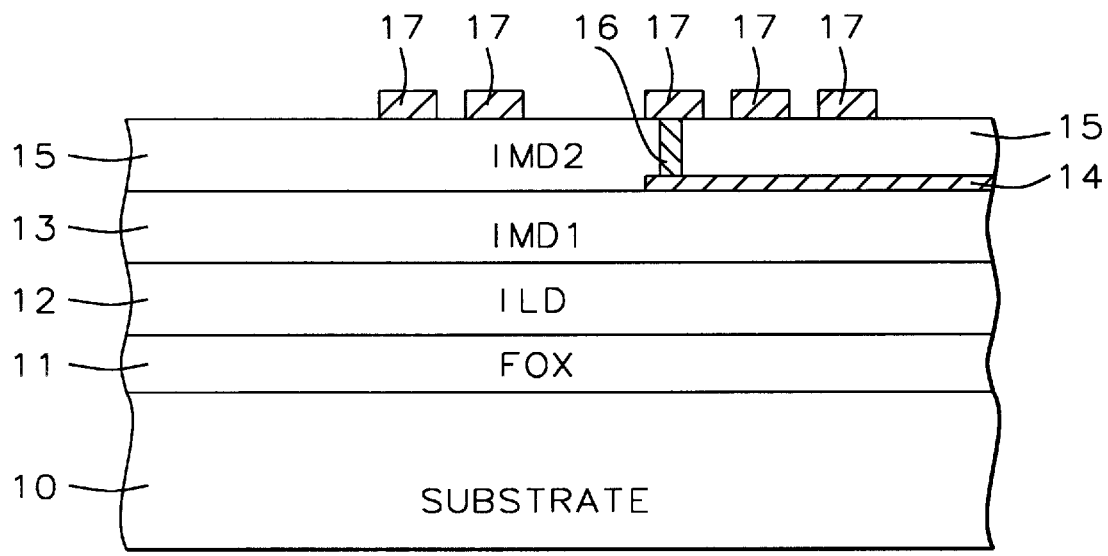
FIG. 1 – Prior Art
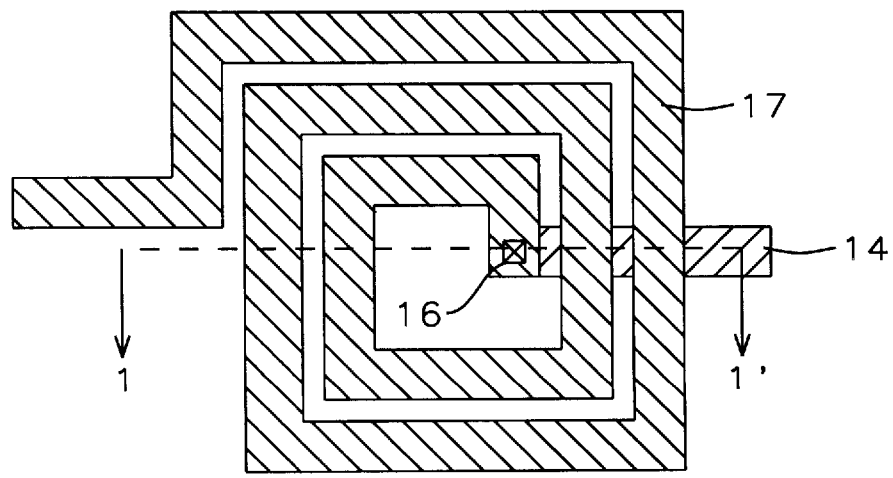
FIG. 2 – Prior Art

METHOD FOR REDUCING SUBSTRATE CAPACITIVE COUPLING OF A THIN FILM INDUCTOR BY REVERSE P/N JUNCTIONS

BACKGROUND OF THE INVENTION (1) Field of the Invention

The invention relates to processes for the manufacture of semiconductor devices and more particularly to processes related to the formation of inductive elements in thin film integrated circuits.

(2) Background of the Invention and Description of Previous Art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. Patterning of the devices elements within the semiconductor surface as well as those lying above the surface such as polysilicon gates and the wiring levels and their via/contact interconnections are accomplished by photolithography. Passive circuit elements such as resistors, capacitors, and inductors are generally patterned over insulative layers deposited on the surface of the semiconductor wafer.

The integration of metal coil inductors into the architecture of integrated circuit chips is relatively recent technology. The benefits of this integration are realized in improved circuit performance as well as a reduction of component space. Not only have metal coil inductors been integrated into monolithic integrated circuit chips, but they have been provided with thin film cores of magnetic and ferromagnetic materials to improve their performance. Among the many problems faced by chip designers who incorporate inductive component on integrated circuit chips is excessive capacitance between the inductor and the substrate. This capacitance greatly reduces the performance of the inductor at high operating frequencies, for example, above1 GHz.

Desaigouder, et.al., U.S. Pat. No. 5,450,263 cites numerous methods for forming inductors in metallization layers over semiconductor integrated circuits. These methods include the suspension of the inductive components over air gaps using bridges with insulative members in order to lower capacitive coupling to the substrate. Abidi, et.al., U.S. Pat. No. 5,539,241 suspends an inductor coil over an air pit formed by anisotropically etching out a portion of the subjacent silicon substrate after the coil is patterned on an insulative layer. Placing a substantial air gap between the inductor and the substrate is an effective way of reducing the capacitance and improving high frequency performance. However, the resultant floating structure is very delicate and can easily be fatally damages during manufacture. Another approach towards the incorporation of a low dielectric constant material between the inductor and the substrate is described by Xie, U.S. Pat. No. 5,736,749. A portion of the silicon substrate beneath the inductive element is selectively made porous by anodic etching of the silicon.

Yu, et.al., U.S. Pat. No. 5,770,509 shows a method for decreasing inductor-to-substrate capacitance by forming a pattern of polysilicon filled trenches in the silicon, running parallel to, and external to the outside of each side of the superjacent inductor metal lines. The polysilicon in the trenches is doped to a conductivity type opposite to that of the substrate. By applying a reverse bias between the polysilicon in the trenches and the substrate, a depletion region is formed between the polysilicon trenches, extending and linking up under the inductor metal. The added series capacitance of the depletion region lowers the overall substrate capacitance. The structure requires extensive additional processing and requires the application of a reverse bias to establish and sustain the depletion region under the inductor coils. Yu's method is difficult and complex and requires reverse biasing. Although it includes only one junction, the method is difficult and complex, requiring the introduction of trench embedded metallization within the silicon and means for bias application. In addition, the design is prone to considerable cross-talk between the inductor and the metallization that provides the junction biasing.

FIG. 1 shows a cross section of an inductor coil 17 formed on an upper level insulative layer of an integrated circuit by conventional means. Specifically, the inductor coil is formed on a second IMD layer 15 and a center connection to the coil 17 is made through a conductive via 16 which connects to a metal stripe 14 on the next subjacent metallization level. The insulative layers which are used in forming integrated circuits elsewhere on the chip, are retained in the inductor region to build up dielectric thickness between the inductor and the silicon substrate 10, thereby lowering the capacitive coupling. In the structure shown in FIG. 1, these comprise a field oxide 11 (FOX), which is formed in the integrated circuit to isolated the semiconductive devices; an ILD (inter level dielectric) layer 12, through which contacts are fabricated to the elements of the semiconductive devices; a first 23 (IMD1) and a second 15 (IMD2) IMD (inter metal dielectric) layer, which insulate between wiring levels in the circuit.

A planar view of the inductor coil is shown in FIG. 2, wherein the cross section of FIG. 1 is designated by the line 1–1'. Although the cumulative thickness of the insulative layers between the inductor coil 17 can be about 0.3 microns or greater, it would be desirable to still further reduce the capacitive coupling of the inductor coil 17 from the substrate 10 with minimal additional process complexity.

SUMMARY OF THE INVENTION

It is an object of this invention to provide an improved method for reducing the inductor to substrate capacitance of an inductor formed patterned in a metallization layer of an integrated circuit.

It is another object of this invention to improve the high frequency performance of an inductor formed in an integrated circuit.

It is yet another object of this invention to provide a method for reducing inductor-to-substrate capacitance without requiring the application of electrical bias.

It is still another object of this invention to provide a method for forming a inductor element in a CMOS integrated circuit with low substrate capacitance with low added process complexity.

These objects are accomplished by forming the inductor in an uppermost metallization layer of the integrated circuit over a region of the silicon substrate which has a p-well region beneath. The p-well region is surrounded by an n-type region which is formed by a high energy ion implantation of phosphorous, prior to the formation of the p-well. The inductor is formed over an accumulation of several dielectric layers which are used in the formation of other portions of the integrated circuit as field oxide (FOX), ILD (inter level dielectric) and IMD (inter metal dielectric) layers. The deep, high energy (>400 keV), phosphorous implantation forms a lightly doped n-type region beneath and adjacent to the p-well. This gives rise to two back-to-back p/n junctions between the p-well and the p-type substrate. The combined capacitance of these two serial junctions in series combination with the capacitances of the dielectric layers reduces the inductor to substrate capacitance by a factor of between about 2 and 20.

BRIEF DESCRIPTION OF THE DRAWINGS

FIG. 1 is a cross sectional view of an inductor formed over insulative layers on a silicon substrate by conventional methods.

FIG. 2 is a plan view of an inductor formed over insulative layers on a silicon substrate by conventional methods.

DESCRIPTION OF THE PREFERRED EMBODIMENTS

Figure 3A:
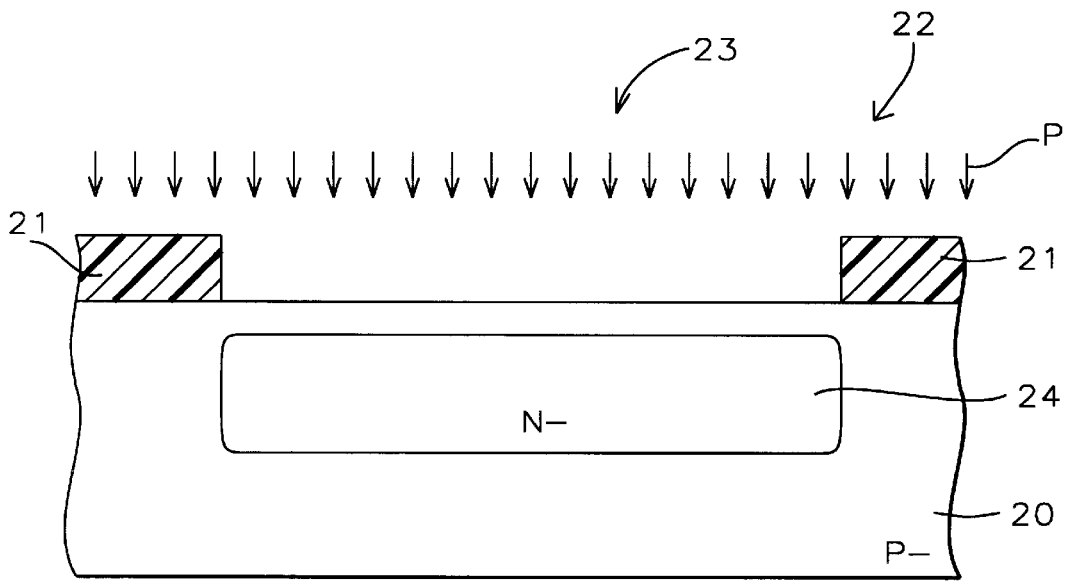
FIG. 3A and FIG. 3B are cross sectional views of a region of a silicon wafer in which an inductor is formed according to an embodiment of this invention.

In a first embodiment of this invention an inductor is formed over a plurality of insulative layers deposited in a designated region of a silicon wafer. The embodiment will first be illustrated in the inductor region only. Later the relationship between the inductor region and concurrently formed CMOS devices, using twin-well or retrograde twin-well CMOS technology will be shown. A p-type silicon wafer 20 is provided Referring to FIG. 3A there is shown a cross section of a portion of the wafer 20 wherein an inductor is to be formed.

Photoresist 21 is deposited and an opening 23 defining a region 22 is patterned on the wafer 20. In the embodiment the opening 23 is a planar square with dimensions of 140 microns by 140 microns or thereabout. An inductive element with planar dimensions of 100 microns by 100 microns or thereabout will later be formed over the region 22. The opening 23 is made large enough that the entire inductive element will lie over it. Phosphorous is implanted into the silicon at a dose of between about $2\times10^{12}$ and $3\times10^{12}$ atoms/cm$^2$ at an energy of between about 400 and 450 keV to form a deep n-type region 24. This energy places the centroid (the point of maximum concentration) of the phosphorous distribution at a depth in the silicon of about 0.6±0.1 microns.

The photoresist pattern 21 is stripped using conventional methods, for example plasma ashing or by commercial liquid stripper and the wafer 20 is then subjected to thermal annealing at a temperature between about 1,000 and 1,050° C. to further diffuse the implanted species and to make them electrically active. During the annealing, the phosphorous concentration at the wafer surface increases and becomes n-type.

Figure 3B:
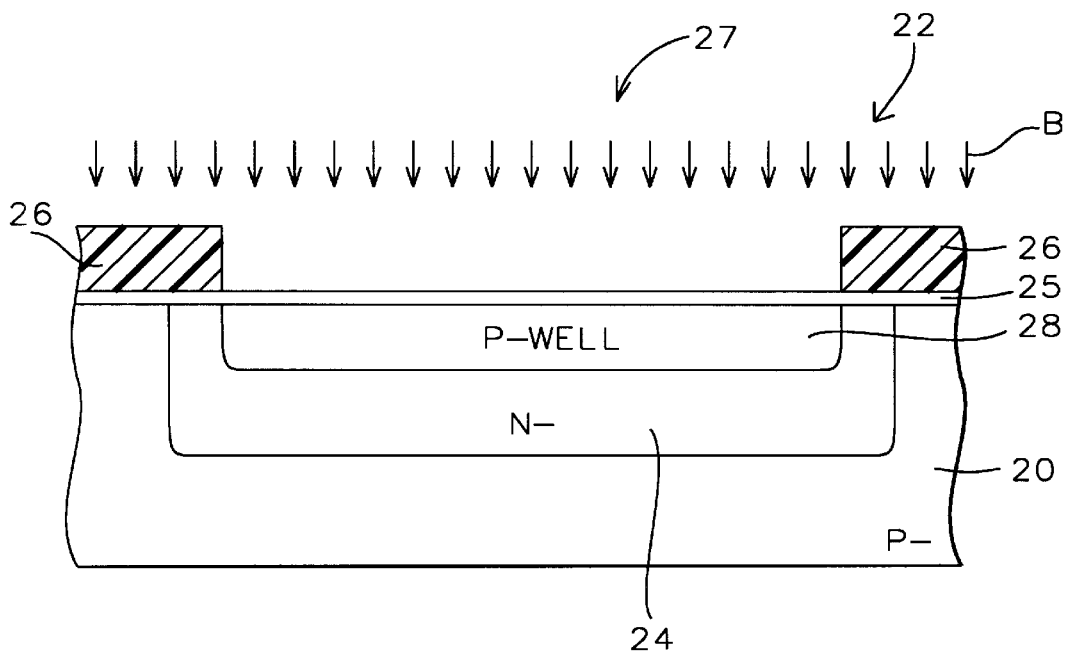

Referring now to FIG. 3B, a screen oxide 25 is grown over the wafer surface by thermal oxidation and a second photoresist layer 26 is applied and patterned to define an opening 27 smaller than the opening 23 and concentric with the deep n-implant 24. In the example described by the embodiment, the planar dimensions of the opening 27 are 125 microns by 125 microns or thereabout. The spacing between the perimeter of the opening 27 and the perimeter of the opening 23 is between about 5 and 10 microns. The screen oxide 25 is optional and may be omitted. A p-well 28 is formed in the opening 27 by ion implantation of boron into the silicon using the photoresist as a mask. p-well implantations are common in CMOS technology and the process and doping parameters for forming the p-well 28 are well known. The depth of the p-well 28 is between about 0.3 and 0.5 microns. The boron implant comprises a dose of between about $1\times10^{13}$ and $2\times10^{13}$ atoms/cm$^2$ at an energy of between about 150 and 200 keV. The resultant boron concentration in the p-well 28 is between about $1\times10^{17}$ and $1\times10^{18}$ boron atoms/cm$^3$. In a CMOS integrated circuit, the p-well 28 is formed in the same process step that p-wells for n-channel MOSFETs are formed elsewhere on the wafer.

After the p-well 28 is implanted, the resist mask 26 is stripped using conventional methods, for example plasma ashing or by commercial liquid stripper. The wafer is subjected to a conventional thermal annealing to activate the boron dopant species. The screen oxide 25 is removed by a dip in dilute HF. Because the boron implant window 27 is smaller than and concentric with the phosphorous implantation window 23, the resultant n-region 24 engulfs and electrically isolates the p-well diffusion 28 as depicted in the figure.

Figure 4:
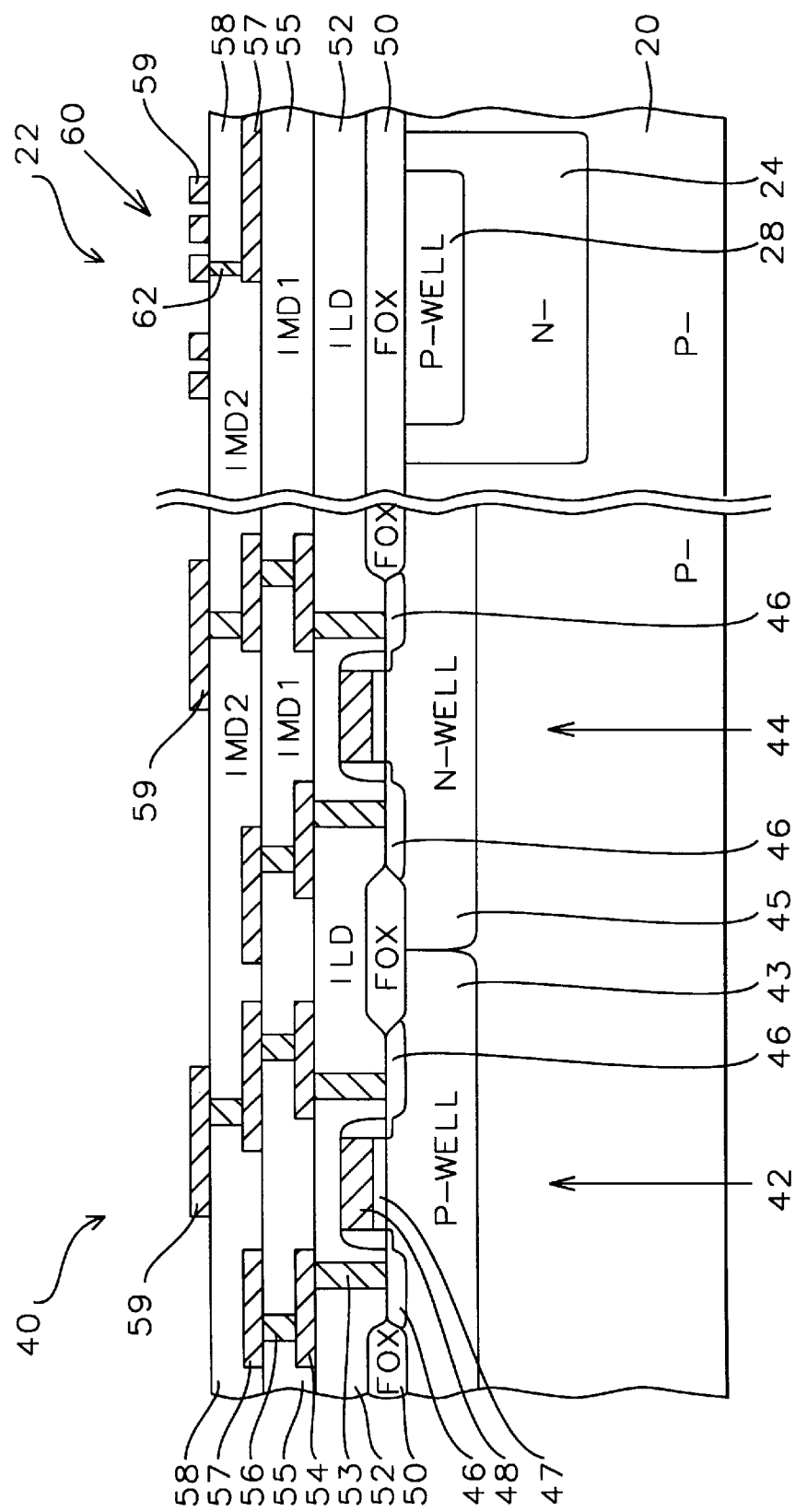
FIG. 4 is a cross section showing a first region of a silicon integrated circuit chip wherein an inductor has been formed according to the teaching of this invention, and a second corresponding region of the same chip with elements of a twin-well CMOS integrated circuit.

Integrated circuit devices such as p- and n-channel MOSFETs are next formed elsewhere on the integrated circuit chip using conventional CMOS processing technology. As these devices and their interconnecting circuitry are built up, the corresponding insulative layers used in the circuits are accumulated over the region 22. Referring to FIG. 4, there is shown the region 22 with a number of insulative layers accumulated in the formation of a twin-well CMOS integrated circuit 40 which has been formed concurrently in another region of the same chip. The total thickness of the accumulated insulative layers is between about 2 and 2.5 microns. The CMOS circuit contains a p-channel MOSFET 42 and an n-channel MOSFET 44 with three metallization levels. The p-well 43 is formed concurrently with the p-well 28 in the inductor region 22. The lowermost layer 50 comprises a field oxide (FOX) which is grown to isolate the MOSFETs 42,44 and is also formed over the p-well 28 in the inductor region 22. The MOSFET elements which are the source/drain regions 46, the gate oxides 47, and polysilicon gate electrodes 48 are formed by well known CMOS processing methods. The ILD layer 52 through which contacts 53 are formed to the device elements, and the superjacent first 55 and second 58 IMD layers are retained in the inductor region 22 to build up the dielectric layer thickness. The inductor coil 60 is formed from a second 57 and a third 59 metallization layer with an interconnecting via 62. The inductor coil 59 is confined within a planar region measuring 100 by 100 microns or thereabout, which lies entirely over the p-well region 28.

Alternately, the low capacitively coupled inductor structure of the invention may be formed independently, without including the interconnection circuitry in the region 40, by depositing an insulative layer between about 2.5 and 5 microns thick on the silicon wafer surface after the n-region 24 and the p-well 28 have been formed in accordance with the first embodiment, and then forming the inductor 59 with the wiring interconnection 57, 62.

Figure 5:
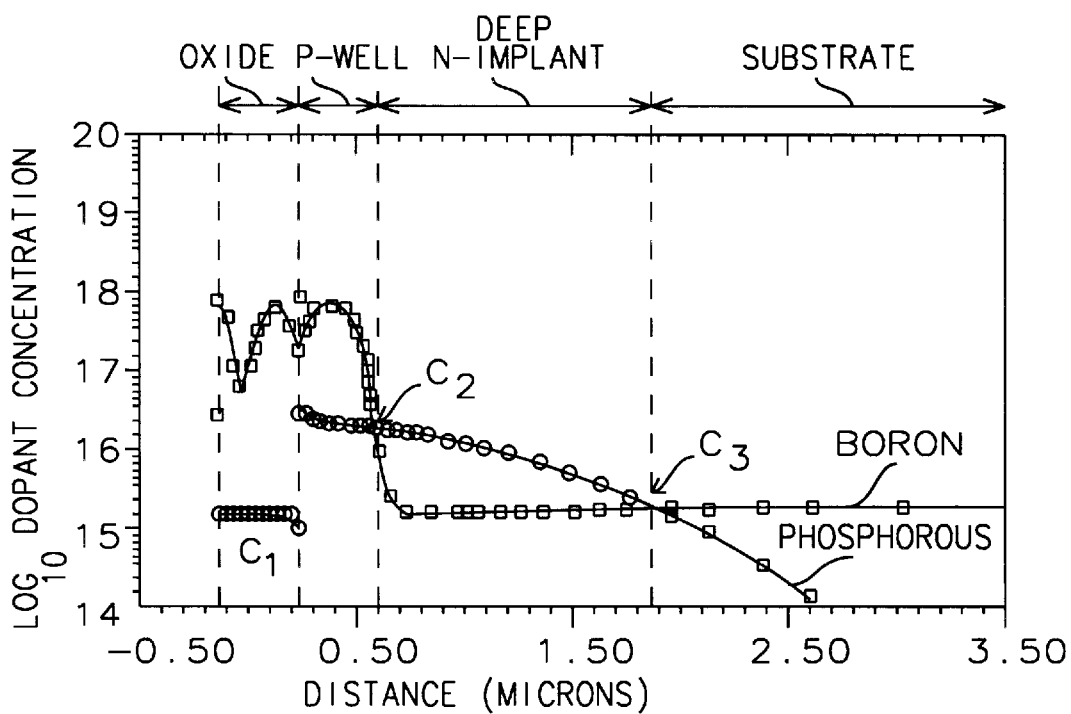
FIG. 5 is a dopant profile of the embodiment of this invention showing the doping of boron and phosphorous along a direction perpendicular to the surface of the wafer.

In FIG. 5 there is shown boron and phosphorous dopant profiles in the inductor region of a structure wherein the inductor coil is formed in a fourth metallization level. The dose of the deep phosphorous implant was $2.5 \times 10^{12}/cm^2$ at an energy of 420 keV and at an implant angle of 7 degrees to prevent channeling. The profile was measured by ESCA (electron spectroscopy for chemical analysis) analysis, on a test wafer which received the deep phosphorous implant and the p-well implant. The cumulative thickness of the insulative layers, which include BPSG (borophosphosilicate glass) and silicon oxide layers was 0.35 microns.

The three capacitances, serially connected between the inductor coil 60 and the substrate 20 are shown as $C_1$, the total capacitance of the insulative layers on the silicon; $C_2$, the depletion layer capacitance of the p/n junction between the p-well 28 and the deep phosphorous implant region 24; and $C_3$, the depletion layer capacitance of the n/p junction between the deep phosphorous implant region 24 and the substrate 20.

Figure 6:
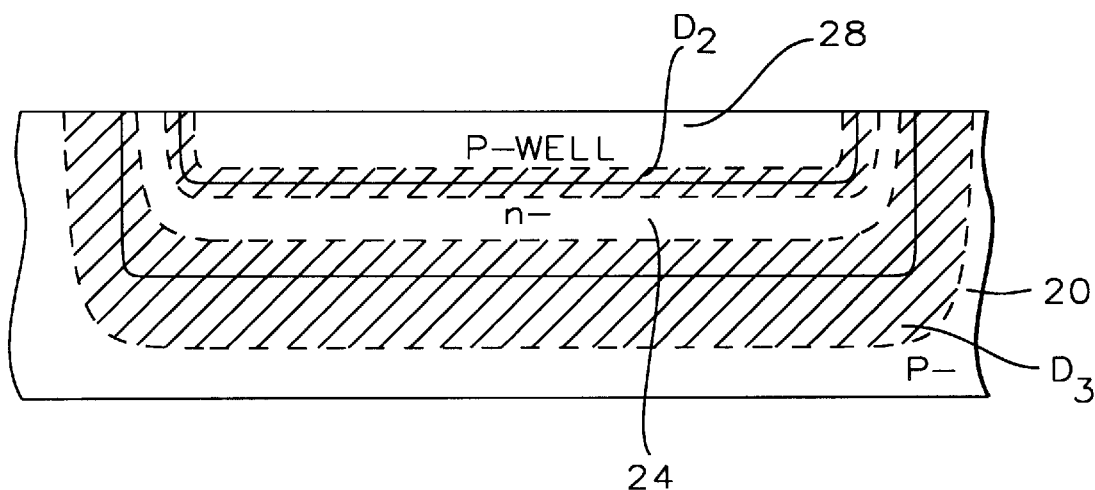
FIG. 6 is a cross section showing, in phantom, the depletion regions of two back-to-back reverse p/n junctions formed according to the teaching of this invention, in a region of a silicon wafer over which an inductor is to be formed.
Figure 7:
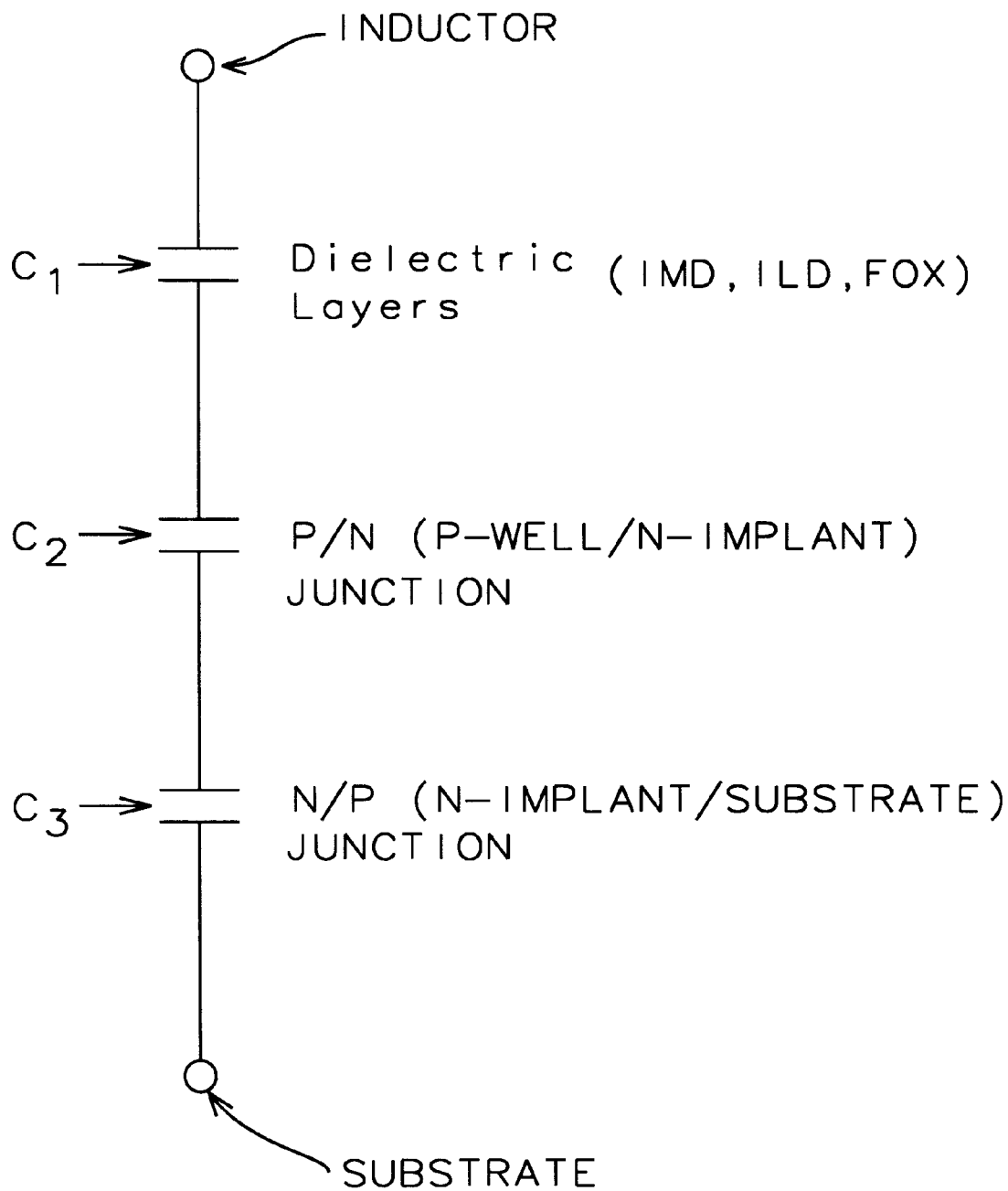
FIG. 7 is a circuit diagram of the capacitive components serially connected between an inductor and a substrate prepared according to the teaching of this invention.

FIG. 6 shows, in shaded phantom, the approximate shape of the depletion regions $D_2$ and $D_3$ which give rise to the capacitances $C_2$ and $C_3$ respectively. It can be seen in the figure and from the doping profile, that the $C_3$ is of lower capacitance per unit area than $C_2$. The circuit equivalent of the three capacitances is shown in FIG. 7. By incorporating the two back-to-back p/n junctions which form $C_2$ and $C_3$, in series with the dielectric capacitance $C_1$, the total capacitance can be lowered by a factor of between about 2 and 20 of that of the dielectric capacitance $C_1$ alone. The performance of the inductor is particularly good when operated in the rf (radio frequency) region.

The embodiment uses the example of incorporating two reverse p/n junctions between the inductor and the substrate to lower the capacitance coupling of an inductor in a twin-well CMOS integrated circuit. It should be well understood by those skilled in the art that such back to back p/n junctions can be formed in concert with other types of integrated circuits by applying procedures and principles taught by this invention. While the invention has been particularly shown and described with reference to the preferred embodiments thereof, it will be understood by those skilled in the art that various changes in form and details may be made without departing from the spirit and scope of the invention.

While the embodiments of this invention utilize a p-type silicon substrate, an n-type silicon substrate could also be used without departing from the concepts therein provided. In the case of an n-type substrate, the conductivity type of the other contributing elements to the invention are correspondingly reversed, substituting a p-type dopant, for example boron, for the deep implantation and forming an n-well over the deep implanted region, thereby forming two back-to-back reversed p/n junctions.

What is claimed is:

1. A method for forming an inductor on a silicon wafer substrate comprising the steps of:
   (a) providing a silicon wafer of a first conductivity type;
   (b) patterning a first photoresist layer to define a first opening in a region of said wafer whereover an inductor is to be formed;
   (c) implanting a first dose of ions of a second conductivity type into said first opening at a first energy placing the centroid of said first dose at a first depth below the silicon surface, forming a pocket of said second conductivity type;
   (d) removing said first photoresist layer;
   (e) subjecting said wafer to a first thermal annealing;
   (f) patterning a second photoresist layer defining a second opening, wholly within and concentric with said first opening and spaced inward from the perimeter of said first opening by a gap;
   (g) implanting a second dose of ions of said first conductivity type at a second energy into said wafer thereby forming a well of said first conductivity type, and wherein said second dose is placed at a second depth which is shallower than said first depth;
   (h) removing said second photoresist layer;
   (i) subjecting said wafer to a second thermal annealing;
   (j) forming one or more insulative layers over said region; and
   (k) forming an inductor element on said insulative layers and lying entirely over said well.

2. The method of claim 1 wherein said first conductivity type is p-type.

3. The method of claim 2 wherein said first dose is between about $2 \times 10^{12}$ and $3 \times 10^{12}$ ions/cm$^2$ of phosphorous and said first energy is between about 400 and 450 keV.

4. The method of claim 2 wherein said first thermal annealing is conducted at a temperature of between about 1,000 and 1,050° C.

5. The method of claim 1 wherein said first depth is between about 0.55 and 0.65 microns.

6. The method of claim 2 wherein said second dose is between about $1 \times 10^{13}$ and $2 \times 10^{13}$ ions/cm$^2$ of boron and said second energy is between about 150 and 200 keV.

7. The method of claim 1 wherein said gap is between about 5 and 10 microns.

8. The method of claim 1 whereby said pocket is extended to the silicon surface around the periphery of said well by of dopant diffusion during said first and second thermal annealing, thereby forming a continuous zone of said second conductivity type between said well and the body of said wafer.

9. The method of claim 1 wherein the combined thickness of said one or more insulative layers is between about 2.5 and 5 microns.

10. The method of claim 1 wherein the planar dimensions of said first opening are 140 microns by 140 microns or thereabout, the planar dimensions of said second opening are 125 microns by 125 microns or thereabout, and said inductor lies within a planar region having dimensions of 100 microns by 100 microns or thereabout.

11. A method for forming a CMOS integrated circuit with an inductive element comprising;
   (a) providing a silicon wafer of a first conductivity type;
   (b) patterning a first photoresist layer to define a first opening in a first region of said wafer whereover an inductor is to be formed;
   (c) implanting a first dose of ions of a second conductivity type into said first opening at a first energy placing the centroid of said first dose at a first depth below the silicon surface, forming a pocket of said second conductivity type;
   (d) subjecting said wafer to a first thermal annealing;
   (e) removing said first photoresist layer;
   (f) patterning a second photoresist layer defining MOSFET wells of said first conductivity type in a second region of said wafer and a second opening in said first region, wholly within and concentric with said first opening and spaced inward from the perimeter of said first opening by a gap;

(g) implanting a second dose of ions of said first conductivity type at a second energy into said wafer thereby forming MOSFET wells of said first conductivity type in said second region and a single well of said first conductivity type in said first region, and wherein said second dose is placed at a second depth which is less than said first depth;

(h) removing said second photoresist layer;

(i) patterning a third photoresist layer defining MOSFET wells of said second conductivity type in said second region;

(j) implanting a third dose of ions of said second conductivity type at a third energy into said wafer thereby forming MOSFET wells of said second conductivity type;

(k) removing said third photoresist layer;

(l) subjecting said wafer to a second thermal annealing;

(m) forming a field isolation on said wafer;

(n) forming MOSFETs in said MOSFET wells;

(o) forming an interlevel dielectric layer over said wafer;

(p) forming contacts to elements of said MOSFETs in said interlevel dielectric layer;

(q) forming a plurality of wiring levels, spaced apart vertically, by inter metal dielectric layers, connected to said contacts and interconnected by conductive vias, while retaining only said field isolation, said interlevel dielectric layer and said inter metal dielectric layers over said first region, thereby forming an integrated circuit and an accumulation of insulative layers over said first region; and (r) forming an inductor over said accumulation of insulative layers.

12. The method of claim 11 wherein said first conductivity type is p-type.

13. The method of claim 12 wherein said first dose is between about $2 \times 10^{12}$ and $3 \times 10^{12}$ ions/cm$^2$ of phosphorous and said first energy is between about 400 and 450 keV.

14. The method of claim 12 wherein said first thermal annealing is conducted at a temperature of between about 1,000 and 1,050° C.

15. The method of claim 11 wherein said first depth is between about 0.55 and 0.65 microns.

16. The method of claim 12 wherein said second dose is between about $1 \times 10^{13}$ and $2 \times 10^{13}$ ions/cm$^2$ of boron and said second energy is between about 150 and 200 keV.

17. The method of claim 11 wherein said gap is between about 5 and 10 microns.

18. The method of claim 11 whereby said pocket of said second conductivity type is extended to the silicon surface around the periphery of said well as a result of dopant diffusion during said first and second thermal annealing, thereby forming a continuous zone of said second conductivity type between said single well and the body of said wafer.

19. The method of claim 11 wherein said third dose is between about $1 \times 10^{13}$ and $2 \times 10^{13}$ ions/cm$^2$ of phosphorous and said third energy is between about 450 and 500 keV.

20. The method of claim 11 wherein the combined thickness of said accumulation of insulative layers is between about 2.5 and 5 microns.

21. The method of claim 11 wherein the planar dimensions of said first opening are 140 microns by 140 microns or thereabout, the planar dimensions of said second opening are 125 microns by 125 microns or thereabout, and said inductor lies within a planar region having dimensions of 100 microns by 100 microns or thereabout.

* * * * *